(12) United States Patent
Kurozumi et al.

(10) Patent No.: US 7,539,071 B2
(45) Date of Patent: *May 26, 2009

(54) SEMICONDUCTOR DEVICE WITH A RELIEF PROCESSING PORTION

(75) Inventors: Tomohiro Kurozumi, Kyoto (JP); Yasuhiro Agata, Osaka (JP); Osamu Ichikawa, Osaka (JP); Shintaro Nagai, Kanagawa (JP)

(73) Assignee: Panasonic Corporation, Osaka (JP)

( * ) Notice: Subject to any disclaimer, the term of this patent is extended or adjusted under 35 U.S.C. 154(b) by 70 days.

This patent is subject to a terminal disclaimer.

(21) Appl. No.: 11/806,308

(22) Filed: May 31, 2007

(65) Prior Publication Data

US 2007/0280015 A1   Dec. 6, 2007

(30) Foreign Application Priority Data

May 31, 2006   (JP)   .............................. 2006-152200

(51) Int. Cl.
*G11C 7/00* (2006.01)
(52) U.S. Cl. .................. 365/200; 365/201; 365/221; 365/225.7
(58) Field of Classification Search .................. 365/200, 365/201, 221, 225.7
See application file for complete search history.

(56) References Cited

U.S. PATENT DOCUMENTS

| 5,313,424 | A | 5/1994 | Adams et al. |
| 5,801,986 | A | 9/1998 | Matsumoto et al. |
| 6,898,143 | B2 | 5/2005 | Puri et al. |
| 6,944,073 | B2 * | 9/2005 | Sato ........................... 365/200 |
| 2006/0179368 | A1 | 8/2006 | Chang et al. |
| 2006/0268633 | A1 | 11/2006 | Kurozumi et al. |

FOREIGN PATENT DOCUMENTS

JP     6-84393     3/1994

* cited by examiner

*Primary Examiner*—Hoai V Ho
(74) *Attorney, Agent, or Firm*—McDermott Will & Emery LLP

(57) ABSTRACT

Each of a plurality of redundant memories includes a plurality of memory cells and is operable to be relieved when a defective cell exists. This plurality of redundant memories can operate independently of each other. A relief processing portion is shared by this plurality of redundant memories. A test circuit inspects the plurality of redundant memories. When the test circuit determines that a defective cell exists, the test circuit outputs relief information to relieve the defective cell. The relief processing portion has a plurality of defect relief portions each having a relief information storage portion operable to store the relief information and performs the processing of relieving the plurality of redundant memories.

65 Claims, 10 Drawing Sheets

|  | TE(Inspection result determination signal) | STATUS |
|---|---|---|
| Pass determination | L | - |
| Relief possibility determination | H | L |
| Relief impossibility determination | H | H |

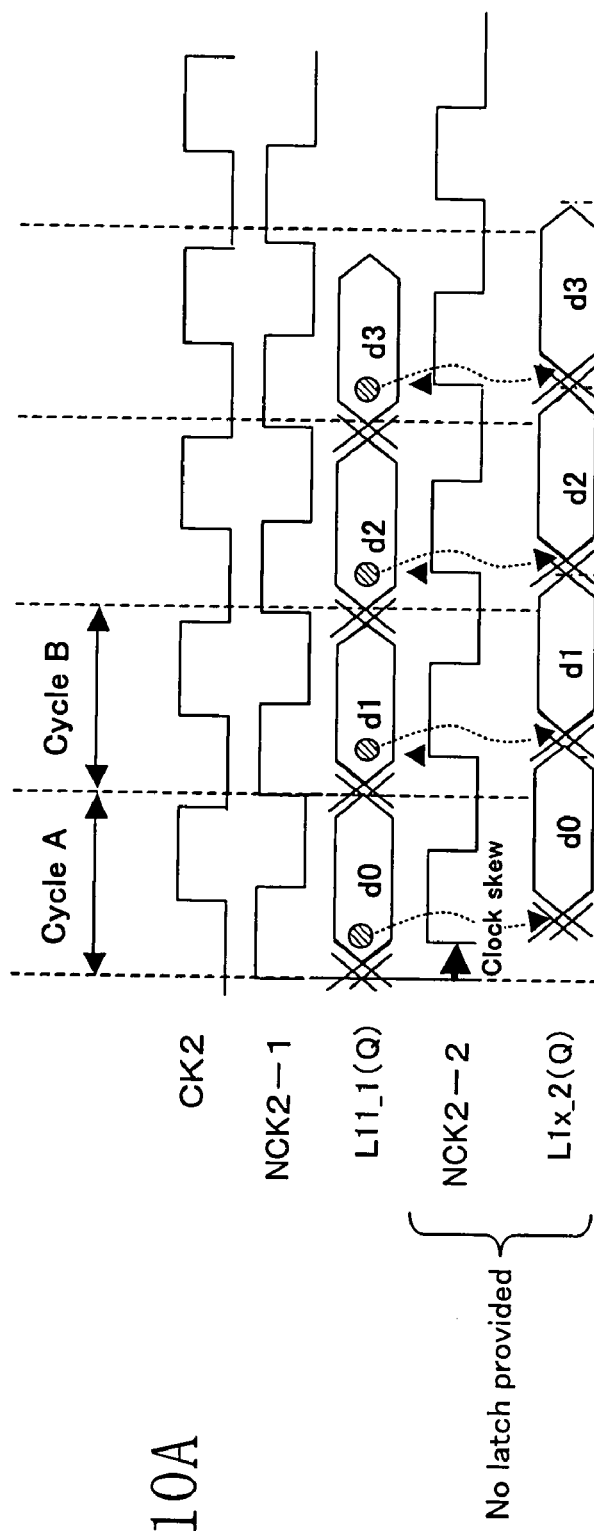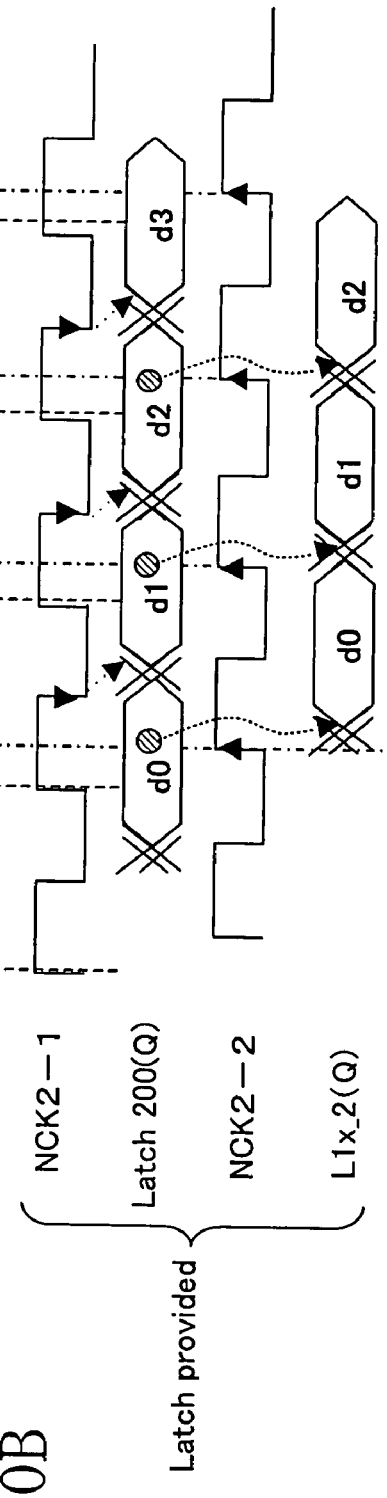
FIG. 10A
FIG. 10B

SEMICONDUCTOR DEVICE WITH A RELIEF PROCESSING PORTION

This application claims priority under 35 U.S.C. §119 on Patent Application No. 2006-152200 filed in Japan on May 31, 2006, the entire contents of which are hereby incorporated by reference.

BACKGROUND OF THE INVENTION

1. Field of the Invention

The present invention relates to a relief mode of a redundant memory in a semiconductor device, and in particular, to a system in which a defective cell in a chip is self-recoverable.

2. Related Art

There has been proposed a method for extracting information to avoid a defect existing in a memory through the operation of a test circuit built in a chip and for fusing down a nonvolatile element by the use of the information (see, for example, Japanese Unexamined Patent Application Publication No. 6-84393).

With large scale integration of a system LSI, the capacity and the number of memories mounted in a chip are increased. Moreover, the number of redundant memories that are mounted in the chip and can be relieved is also increased. However, in the related art disclosed in, for example, Japanese Patent Application No. 2005-155511, the number of redundant memories corresponds one-to-one to the number of relief processing portions, and thus as the number of redundant memories increases, the number of the relief processing portions also increases by the same number. Hence, the chip area is on the increase.

Moreover, in the foregoing related art, relief information storage portions included in the respective detect relief portions are serially connected to each other and relief information outputted from the test circuit is stored in the respective relief information storage portions by a shift operation. This makes longer the time required to transfer the relief information in proportion to the number of the defect relief portions.

Furthermore, in a case where the program operation of the electric fuses is performed on the basis of the information stored in the relief storage portions, when the electric fuses are fused down simultaneously in parallel, an IR drop and the like have an effect on a circuit operation, and hence the electric fuses are serially fused down on the basis of the structure in which the electric fuses are serially connected to each other. This makes longer the time required to fuse down the electric fuses in proportion to the number of the defect relief portions.

SUMMARY OF THE INVENTION

An object of the present invention is to suppress an increase in a circuit area in a semiconductor device including a system in which a defective cell in a chip is self-recoverable and to shorten the time required to transfer relief information for relieving a defect in a redundant memory and the time required to fuse down an electric fuse.

The present invention is a semiconductor device including: a plurality of redundant memories, each of the plurality of redundant memories including a plurality of memory cells, being relievable when a defective cell exists in the memory cells, and being operable independently of each other; and a relief processing portion shared by the plurality of redundant memories wherein when at least one of the plurality of redundant memories has a defective cell, the relief processing portion stores relief information for relieving the redundant memory and performs processing of relieving the redundant memory. The relief processing portion includes a plurality of defect relief portions each having a relief information storage portion capable of storing the relief information, the relief information storage portions being serially connected to each other thereby enabling serial transfer of data. The relief information is stored in the relief information storage portions serially according to its data transfer operation.

According to the present invention, since the relief processing portion is shared by the plurality of redundant memories operable independently of each other, the number of the relief processing portions in a chip can be decreased. Generally, when the effect of mounting the redundancy function of a memory is considered, a condition for providing the highest "yield per unit area" is preferred. Thus, sharing of the relief processing portion realizes a decrease in a chip area and enables it to acquire, even when a memory of smaller capacity than in the art is mounted with a redundancy function, the effect of mounting the redundancy function. Moreover, the number of the relief processing portions can be decreased, so that the time required to transfer relief information and the time required to fuse down an electric fuse can also be shortened.

That is, according to the present invention, in a semiconductor device including a system in which a defective cell in a chip is self-recoverable, it is possible to suppress an increase in a circuit area and to shorten the time required to transfer relief information for relieving a defect in a redundant memory and the time required to fuse down an electric fuse.

BRIEF DESCRIPTION OF THE DRAWINGS

FIG. 10 is a timing chart to show an operation of transferring relief information in the structure in FIG. 9.

DETAILED DESCRIPTION OF THE PREFERRED EMBODIMENTS

The preferred embodiments of the present invention will be described below with reference to the drawings.

First Embodiment

Figure 1:
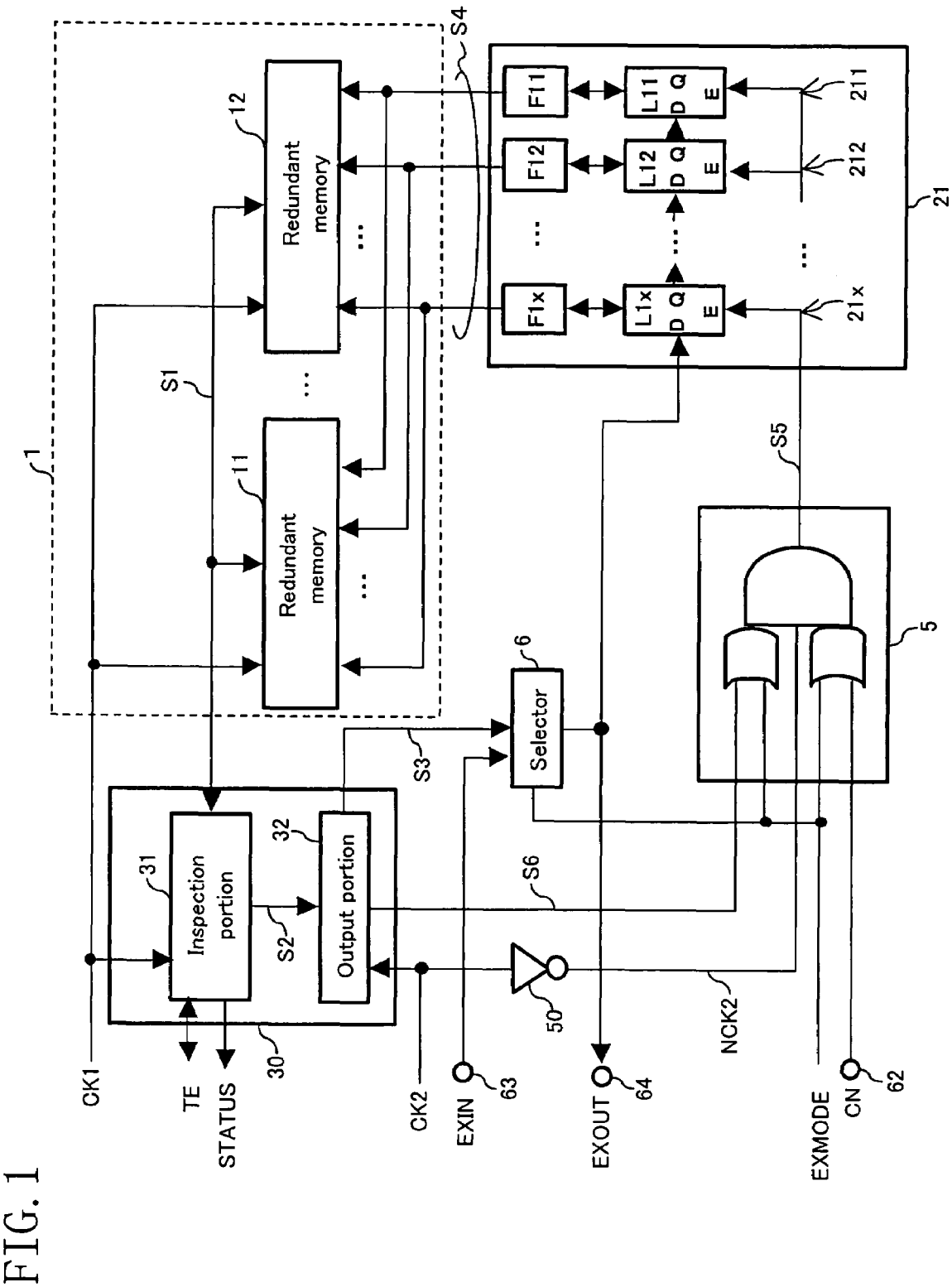
FIG. 1 is a block diagram to show the structure of a semiconductor device according to a first embodiment of the present invention.

FIG. 1 is a block diagram to show the structure of a semiconductor device according to a first embodiment of the present invention. In FIG. 1, reference numerals 11, 12 denote redundant memories each having a plurality of memory cells and a function for relieving a defective memory cell (defective memory), and a reference numeral 21 denotes a relief processing portion for carrying out the relief processing of a plurality of redundant memories including the redundant memories 11, 12. The relief processing portion 21 is shared by the plurality of redundant memories including redundant memories 11, 12. Here, redundant memories other than the redundant memories 11, 12 are omitted in the drawings for the sake of simplification. A redundant memory sharing group 1 is comprised of the plurality of redundant memories including the redundant memories 11, 12. Here, it is assumed that the plurality of redundant memories including the redundant memories 11, 12 can operate independently of each other.

The relief processing portion 21 includes a plurality of defect relief portions 211, 212, ..., and 21x. The defect relief portions 211, 212, ..., and 21x include shift register circuits L11, L12, ..., and L1x, and electric fuse elements F11, F12, ..., and F1x, respectively. Relief information stored in the shift register circuits L11, L12, ..., and L1x are used as program information of the electric fuse elements F11, F12, ..., and F1x, respectively.

In the relief processing portion 21, the shift register circuits L11, L12, ..., and L1x are serially connected to each other so as to transmit data serially. The defect relief portions 211, 212, ..., and 21x in the relief processing portion 21 include the electric fuse elements F11, F12, ..., and F1x, so even if the power source of the semiconductor device is turned off, the defect relief portions 211, 212, ..., and 21x hold the relief information. Here, in place of the electric fuse elements, there may be provided nonvolatile memory elements in which storage data is set by relief information stored in the shift register circuits. Moreover, in FIG. 1, the relief information storage portion in the defect relief portion is comprised of the shift register circuits, but any storage means may be used if the storage means can be serially connected to each other so as to transmit data serially.

A test circuit 30 includes an inspection portion 31 for inspecting the redundant memories 11, 12 and an output portion 32 for outputting relief information S3 for reliving the defective cell. The inspection portion 31 receives a group of inspection external signals TE and makes a desired inspection of the redundant memories 11, 12 by tester control by the use of a group of inspection internal signals including an address signal, a data input/output signal, and a control signal. Then, the inspection portion 31 determines whether the redundant memories 11, 12 pass or fail and when inspection portion 31 determine that the redundant memories 11, 12 fail, the inspection portion 31 determines whether or not redundancy relief can be achieved and outputs inspection result information S2. Here, it suffices for the inspection result information S2 to include at least information to clearly show that the redundant memories 11, 12 pass or fail and information to clearly show whether or not the redundancy relief can be achieved when the redundant memories 11, 12 fail. The output portion 32 outputs relief information S3 serially when the redundancy relief can be achieved by the use of the inspection result information S2. In this regard, for example, when the redundancy relief cannot be achieved, the output portion 32 may output information not to be substantially used for relief.

The test circuit 30 outputs "H" as a relief control signal S6 to control the relief processing portion 21 in such a way as to store the relief information S3. At this time, it suffices to set a condition for outputting "H" as the relief control signal S6 in terms of circuit in the test circuit 30. As a first setting, only when the inspection portion 31 determines that the redundancy relief can be achieved, "H" may be outputted as the relief control signal S6. In this case, it is possible to omit the transmission processing of the relief information to the redundant memory in which relief is not required and hence to shorten a test time.

Moreover, in addition to the first setting condition, as a second setting, it may be set that when the inspection portion 31 determinates two or more times that the redundancy relief can be achieved, "H" is not outputted as the relief control signal S6. That is, when the inspection portion 31 determines that two or more redundant memories can be relieved, it may be also set to determine that all of the redundant memories cannot be achieved. In a structure in which one relief processing portion is shared by a plurality of redundant memories, two or more redundant memories cannot be relieved and hence when it is determined that two or more redundant memories can be relieved, it is determined that all of the redundant memories cannot be relieved. With this, it is possible to stop making remaining inspections in the same chip and hence to shorten the test time.

Furthermore, in addition to the second setting condition, the following setting condition may be set as a third setting condition: a relief address when a relief possibility determination is made first time is compared with a relief address when a relief possibility determination is made second or subsequent time; when the two relief addresses correspond to each other, it is determined that the redundant memories can be relived and "H" is outputted as the relief control signal S6; whereas when the two relief addresses do not correspond to each other, it is determined that the redundant memories cannot be relived and "L" is outputted as the relief control signal S6. With this, even if the relief possibility determination is made two or more times, when the memory cell denoted by the same relief address of the redundant memories fails, these redundant memories can be relieved.

In this regard, when either the relief control signal S6 or a capture control signal CN is "L", a clock S5 is fixed at a level "L".

Further, when the determination is that relief cannot be achieved, the test circuit 30 may output an inspection finish signal to show that subsequent inspections are not required. The inspection finish signal can provide the trigger of processing for stopping making the remaining inspections in the same chip, so the test time can be shortened.

A reference numeral 62 denotes an external input terminal for inputting the capture control signal CN from the outside of the semiconductor device, 63 denotes a relief information external input terminal for inputting relief information EXIN from the outside of the semiconductor device, and 64 denotes a relief information external output terminal for outputting relief information S3 to be given to the relief processing portion 21 to the outside of the semiconductor device.

A selector 6 selects either the relief information S3 outputted from the output portion 32 or the relief information EXIN inputted to the relief information external input terminal 63 and outputs the selected information. The relief information S3 or the relief information EXIN outputted from the selector 6 is given to a D input of the first-stage shift register circuit L1x of the serially connected shift register circuits L11, L12, ..., and L1x of the relief processing portion 21.

A first clock CK1 is given to the inspection portion 31 and the redundant memories 11, 12. That is, the operations of the redundant memories 11, 12 and the inspection of the redundant memories 11, 12 by the test circuit 30 are conducted according to the first clock CK1.

A second clock CK2 is given to the output portion 32 and is given to the relief processing portion 21 as a clock S5 via an inverter 50 and a clock control portion 5. The clock S5 is given to E inputs of the serially connected shift register circuits L11, L12, ..., and L1x of the relief processing portion 21. That is, the operation of storing the relief information S3 serially outputted from the output portion 32 is performed according to the second clock CK2.

Here, since the first clock CK1 and the second clock CK2 are separately provided, they can variously used. For example, it is preferable to use the first clock CK1 as a high-speed clock and to use the second clock CK2 as a low-speed clock. With this, the inspection of the redundant memory can be conducted at high speed, whereas the operation of transferring the relief information not related to system performance is performed at low speed to suppress an increase in a waste circuit area. In this regard, the first clock CK1 and the second clock CK2 may be the same clock.

The clock control portion 5 has a clock NCK2 that is opposite in phase to the second clock CK2, the relief control signal S6 outputted from the output portion 32, the capture control signal CN given to the external terminal 62, and an external input switch signal EXMODE inputted thereto and outputs the clock S5.

At this time, in the output of the clock S5, an input condition is different between a case where information stored in the relief processing portion 21 is the relief information S3 outputted by the output portion 32 and a case where information stored in the relief processing portion 21 is the relief information EXIN inputted to the relief information external input terminal 63.

First, an input condition in a case where the relief information S3 is stored in the relief processing portion 21 is that the external input switch signal EXMODE is in a disabling state. At this time, the relief control signal S6 and the capture control signal CN become effective, and the output of the clock S5 is determined according to the relief control signal S6, the capture control signal CN, and the clock NCK2. That is, it is controlled on the basis of the relief control signal S6 outputted from the output portion 32 whether or not the relief information S3 is stored in the relief processing portion 21.

Here, the circuit may be constructed such that as a fourth setting condition, the control of whether or not the relief information is transferred is performed in consideration of also the state of whether or not the relief information is already transferred to the relief processing portion 21. For example, when the relief information is already transferred to the relief processing portion 21, the circuit may be controlled so as not to transfer the relief information. In this case, a post inspection which will be described later can be omitted.

Of course, irrespective of whether or not the relief information is already transferred to the relief processing portion 21, the relief information may be stored. In this case, a circuit for determining whether or not the relief information is already stored in the relief processing portion 21 does not need to be provided, so the area can be reduced. In this regard, if the post inspection is conducted after the redundant memory is inspected, when the relief information is transferred two or more times, the memory can be determined to be defective.

On the other hand, an input condition in a case where the relief information EXIN is stored in the relief processing portion 21 is that the external input switch signal EXMODE is in an enabling state. At this time, the relief control signal S6 and the capture control signal CN are cancelled, and the output of the clock S5 is determined according to the external input switch signal EXMODE and the clock NCK2. In other words, when the external input switch signal EXMODE is in the enabling state, the clock S5 becomes the same clock as the opposite-phase clock NCK2. In this case, even if the relief control signal S6 and the capture control signal CN are in a control state in which the relief information is not transferred, the relief information can be transferred according to the external input switch signal EXMODE.

Here, when the external input switch signal EXMODE may be used as the switch signal of the selector 6. In other words, when the external input switch signal EXMODE is in the disabling state, the relief information S3 outputted from the output portion 32 is selected, whereas when the external input switch signal EXMODE is in the enabling state, the relief information EXIN inputted to the relief information external input terminal 63 is selected. In this case, the switch signal of the selector 6 does not need to be provided separately.

Figure 2A:
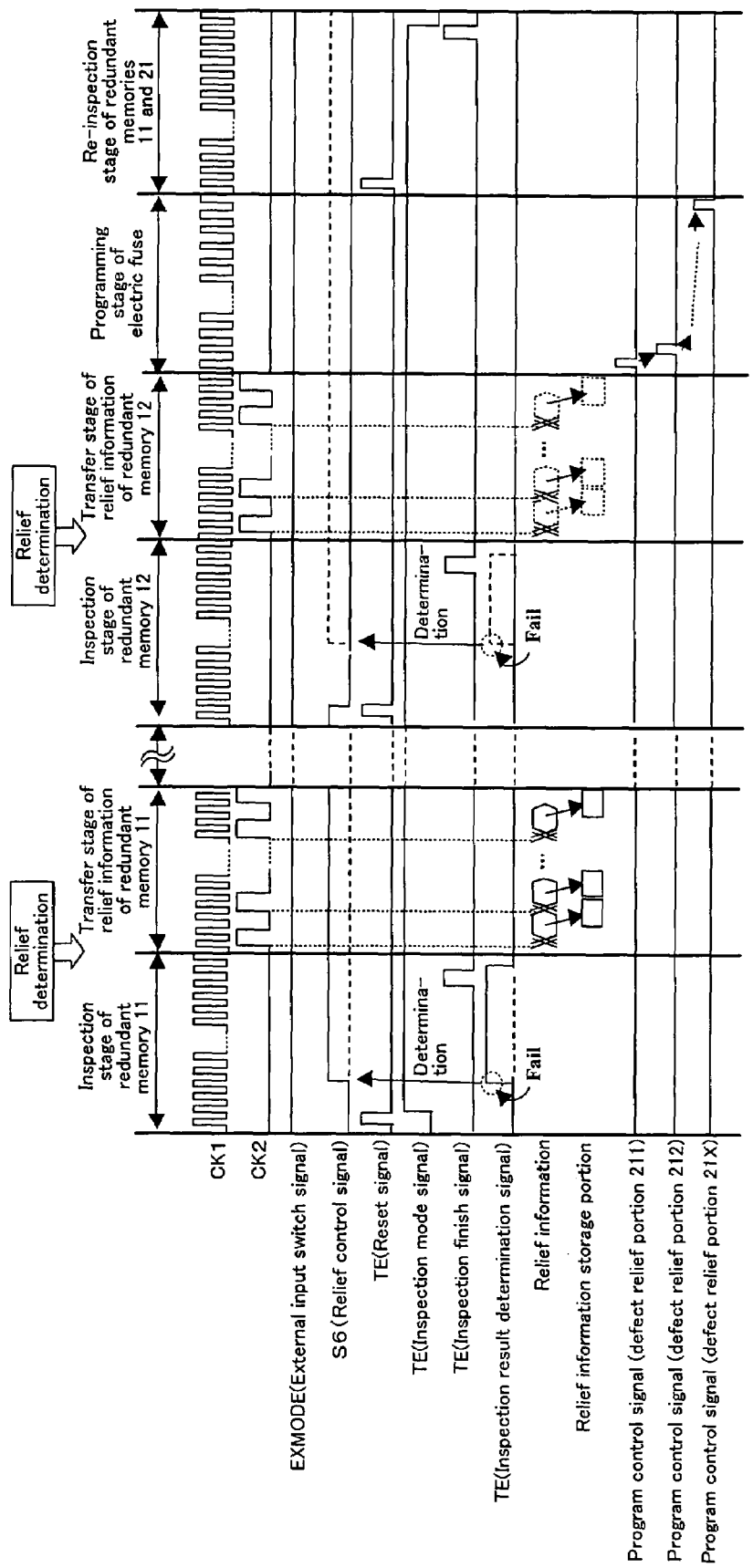
FIG. 2A is a timing chart to show the flow of an inspection using the semiconductor device in FIG. 1.
Figure 2B:
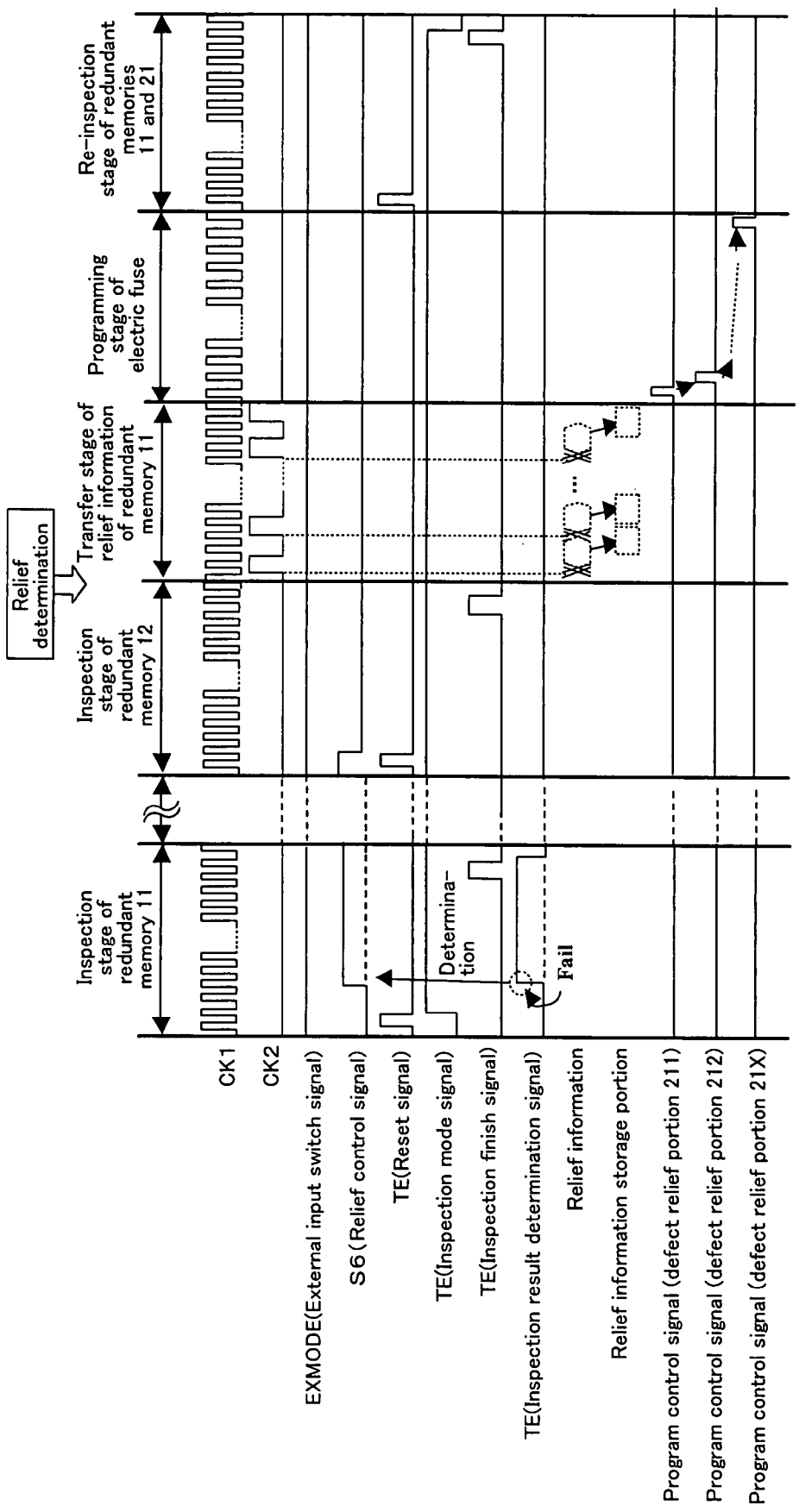
FIG. 2B is a timing chart to show the flow of an inspection using the semiconductor device in FIG. 1.

Hereinafter, a series of inspection operations of the semiconductor device of the present invention will be described. FIG. 2A is a timing chart to show the flow of inspection using the semiconductor device of the present invention. In FIG. 2, a case where a relief determination is made for each redundant memory is shown by way of example. That is, FIG. 2 shows a case where: "inspection step" and "relief information transfer step" are repeatedly performed; the program of the electric fuse is then performed; and a reinspection is finally conducted. On the other hand, in FIG. 2B, a case where a relief determination is made on the basis of the inspection result of all redundant memories is shown by way of example. FIG. 2B is different from FIG. 2A in that "relief information transfer step" is once provided after "inspection step". However, the respective processing steps other than the step of making a relief determination are the same as those in FIG. 2A.

That is, in FIG. 2A, the test circuit 30 conducts the inspection and makes the relief determination for each redundant memory. It is controlled on the basis of the relief determinations of the redundant memories whether or not the relief information S3 is transferred to the relief processing portion 21. In this case, since the relief determination is made for each redundant memory on the basis of the relief determinations, when it is determined in the previously conducted inspection that a certain redundant memory cannot be relieved, the remaining inspections in the same chip can be stopped. With this, the test time can be shortened. On the other hand, in FIG. 2B, the test circuit 30 conducts the inspection and makes the relief determination for all redundant memories. It is controlled on the basis of the relief determinations of all redundant memories whether or not the relief information S3 is transferred to the relief processing portion 21. In this case, for example, when both of the redundant memory cannot be relieved and the redundant memory that can be relieved are included, it is determined that the redundant memories cannot be relieved as a whole because the relief determination is made on the basis of the inspection results of all redundant memories. For this reason, the operation of transferring the relief information is not performed. In other words, the processing of transferring useless relief information can be omitted and hence the test time can be shortened.

Further, after the plurality of redundant memories are inspected and the relief information based on the relief determinations is stored, the relief processing portion 21 performs the relief processing (here, <program step>"). With this, when the redundant memory that cannot be relieved is included, the relief processing can be omitted and hence the test time can be shortened. At this time, when the inspection is conducted under a plurality of voltage conditions, it is preferable that a series of processings from determination processing to relief processing are performed. With this, when the relief determination is made on the basis of the inspection result under all voltage conditions, means for storing the inspection result of the inspection previously conducted needs to be provided and hence the area is increased, but this effect can be eliminated.

Here, referring to the timing chart shown in FIG. 2A, a series of operations of conducting the inspection, determining the inspection result, and transferring the relief information when the inspection result is a relief possibility determination will be described below with reference to the structure shown in FIG. 1.

<1-1. Inspection Step of Redundant Memory 11>

In FIG. 2A, it is assumed that the group of inspection external signals TE includes a reset signal, an inspection mode signal, an inspection finish signal, and an inspection result determination signal. First, the inspection portion 31, the redundant memory 11, and the other redundant memories are initialized by the reset signal. Then, after an inspection mode is set (inspection mode signal is "H"), the inspection of the redundant memory 11 is started in synchronization with the first clock CK1. When a defective cell is found while the inspection is conducted, the inspection result determination signal is changed from "L" to "H" (fail). When the inspection result determination signal is "fail", it is determined whether redundancy relief can be achieved and when it is determined that redundancy relief can be achieved, the relief control signal S6 of "H" is outputted. On the other hand, when it is determined that redundancy relief cannot be achieved, the relief control signal S6 of "L" is outputted. Then, when the predetermined inspection is finished, the inspection finish signal becomes "H" and the test is finished.

<2-1. Relief Information Transfer Step of Redundant Memory 11>

Figure 3:
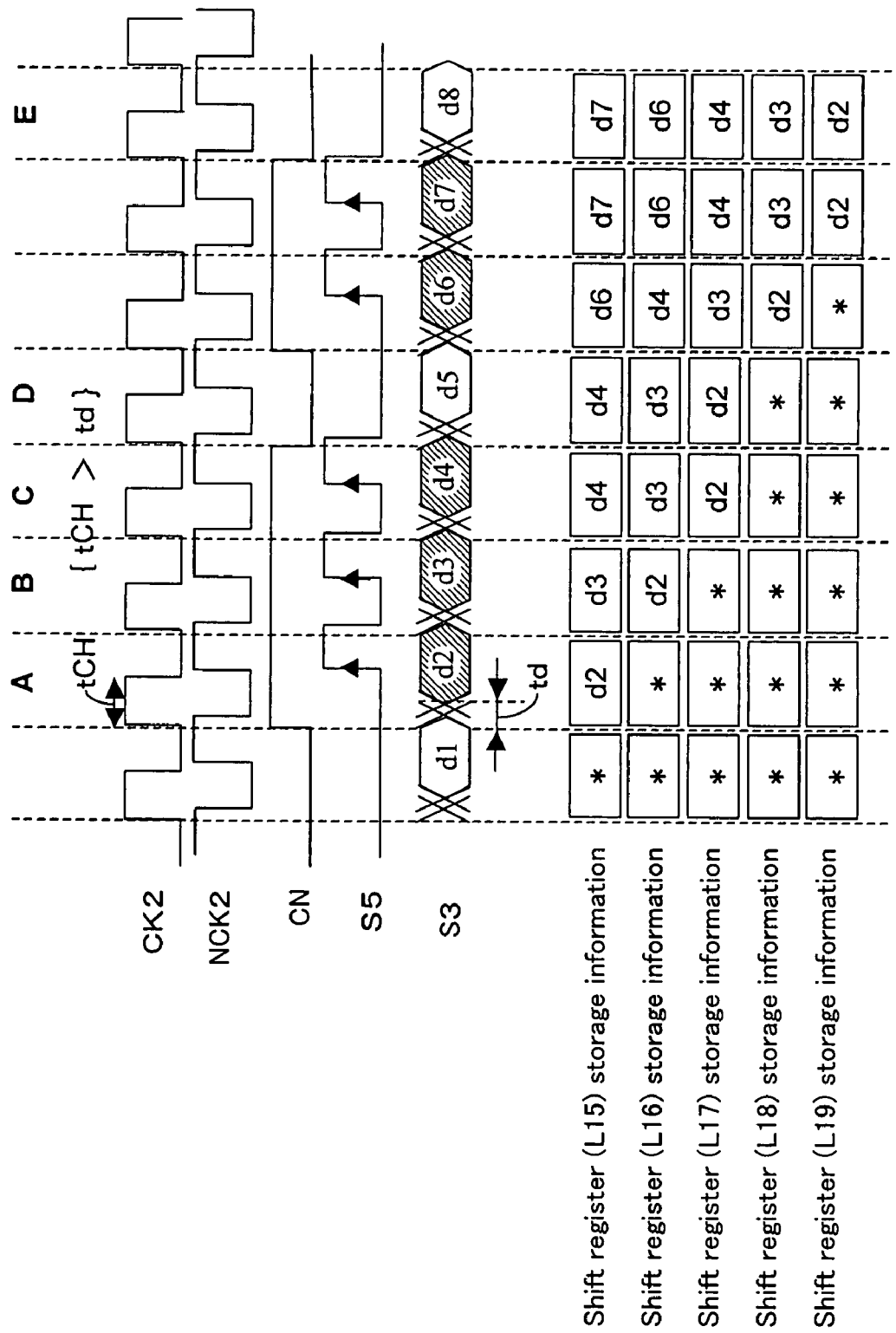
FIG. 3 is a timing chart to show the operation of storing relief information.

FIG. 3 is a timing chart to show the operation of storing the relief information S3 of the redundant memory 11 outputted by the output portion 32. It is assumed that according to the inspection result of the redundant memory 11, it is determined that redundancy relief can be achieved (the relief control signal S6 of "H" is outputted). First, the clock S5 outputted by the clock control portion 5 becomes the same clock as the clock NCK2 that is opposite in phase to the second clock CK2 and has a waveform formed according to the "H/L" state control of the capture control signal CN. Moreover, because the external input switch signal EXMODE is "L", the selector 6 selects the relief information S3 outputted from the output portion 32 and gives the relief information S3 to the relief processing portion 21.

Next, in the relief processing portion 21, it is assumed that x=5, that is, the number of serially connected shift register circuits is five. In other words, the relief information S3 of the output of the selector 6 is first given to the D input of the shift register circuit L15 and then according to the clock S5, the relief information S3 is transferred to the shift register circuits L14, L13, L12, and L11 in this order.

The relief information S3 is outputted from the output portion 32 in synchronization with the rising edge of the second clock CK2. Moreover, when the relief information S3 is truly necessary data, the capture control signal CN is made "H" so as to capture the relief information S3. That is, even if the relief information S3 includes data that is not necessary for redundancy relief, only the truly necessary relief information can be selectively stored in the relief processing portion 21 by the control using the capture control signal CN. The relief information S3 reaches a terminal D of the shift register circuit L15 after a specified signal transmission delay time td passes. Here, it is assumed that the period tCH during which the second clock CK2 is held at the level "H" is guaranteed to satisfy the following relationship in terms of circuit.

tCH>td

For this reason, the clock S5 obtained on the basis of the clock NCK2 that is opposite in phase to the second clock CK2 has a waveform that surely reaches the terminal D of the shift register circuit L15 and then rises up. That is, by producing the clock S5 given to the relief processing portion 21 by the use of the clock NCK2 that is opposite in phase to the second clock CK2, it is possible to produce the effect of facilitating a timing design for surely capturing the relief information S3 into the shift register circuit.

Here, preferably, inspection pattern information is used as the capture control signal CN. The relief information S3 may include information other than information necessary for redundancy relief and it is necessary to prevent the unnecessary information from being captured. Usually, in the logic verification step, it is possible to check by a simulation result waveform whether or not the waveform used for relief information capture control is correct. That is, by giving a logically guaranteed inspection pattern of a format handled by a specified tester into which the simulation result waveform is transformed as the capture control signal CN to the external input terminal 62, it is possible to perform the logically guaranteed safe control. In other words, the relief information can be transferred according to a previously produced test vector.

Now, the output portion 32 serially outputs data "d1" to "d8" as the relief information S3. Then, it is assumed that among the outputted data, the hatched data "d2", "d3", "d4", "d6", and "d7" are stored as truly necessary relief information in the shift register circuits L11 to L15. The capture control signal CN becomes "H" only in the periods during which the data "d2", "d3", "d4", "d6", and "d7" are outputted.

First, in a cycle (cycle A) in which data "d2" is outputted as the relief information S3, the data "d2" is stored in the shift register L15 at the rising timing of the clock S5 controlled by the capture control signal CN. Next, in a cycle (cycle B) in which data "d3" is outputted as the relief information S3, the data "d3" is stored in the shift register L15 at the rising timing of the clock S5 and the data "d2" stored in the shift register circuit L15 is transferred to the next-stage shift register circuit L14.

Further, in a cycle (cycle C) in which data "d4" is outputted as the relief information S3, the data "d4" is stored in the shift register L15 at the rising timing of the clock S5 and the data "d3" stored in the shift register circuit L15 is transferred to the next-stage shift register circuit L14 and further the data "d2" stored in the shift register circuit L14 is transferred to the next-stage shift register circuit L13.

Still further, in a cycle (cycle D) in which data "d5" is outputted, because the capture control signal CN becomes "L", the clock S5 is held set to "L". For this reason, the data "d5" is not stored in the shift register L15 and data is not transferred between the shift register circuits of the next and subsequent stages, so the stored data is left held.

In the same way, the operation of capturing the relief information S3 and the operation of transferring the data between the shift register circuits are controlled according to the capture control signal CN. Then, after a cycle (cycle E) in which the data "d8" is outputted is finished, there is brought about a state in which the data "d2", "d3", "d4", "d6", and "d7" are stored in the shift register circuits L11 to L15, respectively.

<1-2. Inspection Step of Redundant Memory 12>

The foregoing processing of one set of the inspection step and the relief information transfer step of the redundant memory 11 is serially performed in the same way for all redundant memories sharing the relief processing portion 21. FIG. 2A shows a case where the inspection step and the relief information transfer step of the redundant memory 12 is finally performed. As already described in the <Inspection step of redundant memory 11>, when a defect does not exist in the redundant memory 12, both of the inspection result determination signal and the relief control signal S6 become "L", as shown by solid lines. On the other hand, when a defect exists in the redundant memory 12, both of the inspection result determination signal and the relief control signal S6 are changed from "L" to "H", as shown by broken lines.

<2-2. Relief Information Transfer Step of Redundant Memory 12>

The relief information transfer step of the redundant memory 12 is the same as the relief information transfer step of the redundant memory 11, so its description will be omitted.

By the way, like <Relief information transfer step of redundant memory 12>, "the relief information transfer step" in the redundant memory for which the inspection is conducted the second or subsequent time can be controlled in various ways as shown in the following by changing the inspection sequence.

For example, when only the redundant memory 12 has a defect that can be relieved, the operation shown by the broken line in FIG. 2A is performed. On the other hand, for example, when the redundant memory 11 has a defect that can be relieved and the redundant memory 12 also has a defect that can be relieved, because t the redundant memory 11 and the redundant memory 12 share the relief processing portion 21, actually, redundancy relief cannot be achieved. In this case, although not shown, the chip inspection may be finished without proceeding to "Relief information transfer step of redundant memory 12". Moreover, a specified period corresponding to "Relief information transfer step of redundant memory 12" may be provided and the control of not transferring the relief information or of transferring meaningless information during the specified period may be performed.

In the description up to this point, it is assumed that when the inspection portion 31 determines that the relief can be achieved, "H" is outputted as the relief control signal S6 (the foregoing first setting condition).

In the following, a circuit structure example in a case where when the relief possibility determination is made two or more times (the second setting condition described above) will be described.

Figure 4:
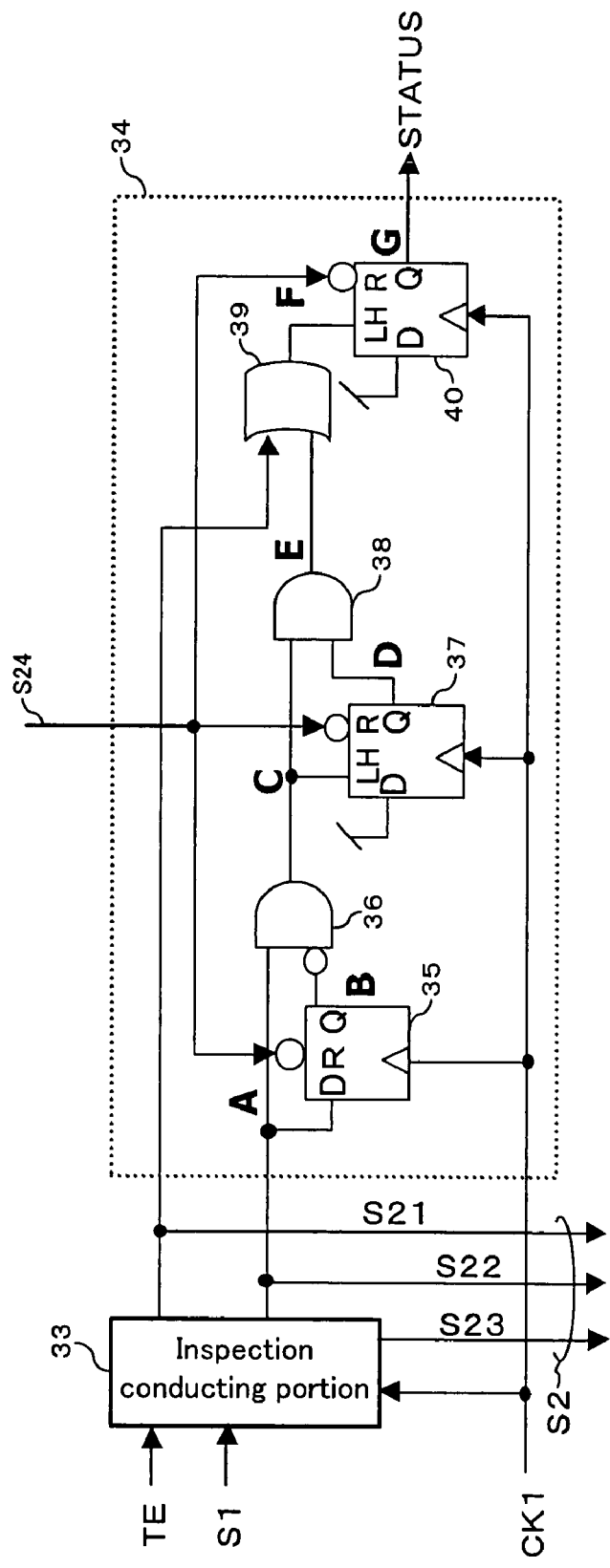
FIG. 4 is a structure example of a circuit in which when a relief possibility determination is made two times, relief cannot be achieved.
Figures 5, 6:
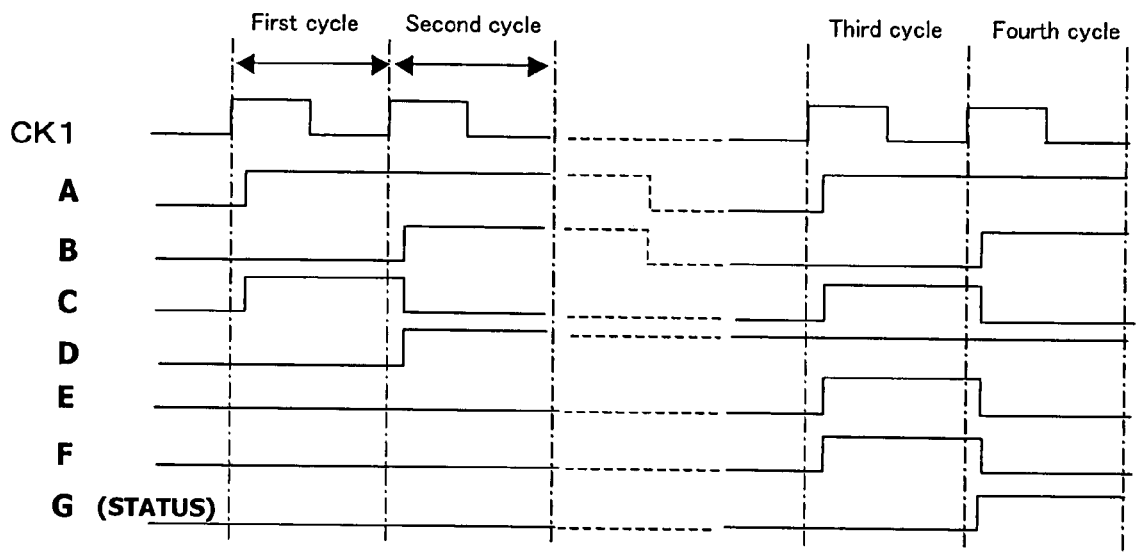
FIG. 5 is a timing chart to show a circuit operation in FIG. 4.
FIG. 6 is a diagram to show a specification setting example for making a relief determination.

FIG. 4 is a circuit structure example of the inspection portion 31 that determines that relief cannot be achieved when the relief possibility determination is made two or more times. In FIG. 4, the inspection portion 31 includes an inspection conducting portion 33 and a relief state control portion 34. When the inspection portion 31 determines two times that relief can be achieved, the inspection portion 31 brings a STATUS signal to "H" as a relief impossibility determination signal. Further, FIG. 5 is a timing chart to show the operation of the circuit structure shown in FIG. 4.

The operation of the circuit shown in FIG. 4 will be described with reference to FIG. 5. FF circuits 35, 37, and 40 are directly initialized by the reset operation of starting an inspection step of each redundant memory and hold "L".

(Relief Determination of Redundant Memory 11)

Now, in the inspection step of the redundant memory 11, it is assumed that the inspection conducting portion 33 detects a defect of the redundant memory 11 and determines that the defect can be relieved. In the first cycle, a relief possibility determination signal S22 (node A) is changed from "L" to "H" in synchronization with the rising edge of the clock CK1. At this time, the value of the node B is held set at "L", so when the node A is changed from "L" to "H", the output signal (node C) of an AND circuit 36 is changed from "L" to "H". The output node D of the FF circuit 37 is "L", so the output node E of an AND circuit 38 is "L". Further, at this time, because the relief can be achieved, a relief impossibility determination signal S21 is held set at "L", so the output node F of an OR circuit 39 is also "L" and the output node G of the FF circuit 40, that is, the STATUS signal is also held set at "L".

Next, in the second cycle, the FF circuit 37 captures "H" in the D input at the rising edge of the clock CK1 because the value of the node C is "H". With this, the node D is changed from "L" to "H". Further, the FF circuit 35 captures the "H" of the node A. With this, the node B is changed from "L" to "H". Thus, the output node C of the AND circuit 36 is changed from "H" to "L". The output node E of the AND circuit 38 is held set at "L" and also at this time because the relief can be achieved, the relief impossibility determination signal S21 is held set at "L" because the relief can be achieved and the output node F of the OR circuit 39 is held set at "L". Hence, the output node G of the FF circuit 40 is "L", that is, it is held determined that the relief can be achieved and the STATUS signal is not changed.

(Relief Determination of Redundant Memory 12)

Let's think a case in which in a state where it is determined in the inspection step of the redundant memory 11 that the redundant memory 11 can be relieved, a defect of the redundant memory 12 is detected further in the inspection step of the redundant memory 12, the defect being able to be relieved.

In the inspection step of the redundant memory 12, it is assumed that the inspection conducting portion 33 detects a defect in the redundant memory 12 and determines that the defect can be relieved. In the third cycle, the relief possibility determination signal S22 (node A) is changed from "L" to "H" in synchronization with the rising edge of the clock CK1. At this time, the value of the node B is held set at "L", so when the node A is changed from "L" to "H", the output signal (node C) of the AND circuit 36 is changed from "L" to "H". The output node D of the FF circuit 37 is changed to "H" in the inspection step of the redundant memory 11, so the output node E of an AND circuit 38 is also changed to "H". At this time, the defect that can be relieved is only detected in the redundant memory 12, so the relief impossibility determination signal 21 is held set at "L", but the value of the output node F of the OR circuit 39 is changed from "L" to "H" by the change of the node E.

Next, in the forth cycle, the FF circuit 37 captures "H" in the D input at the rising edge of the clock CK1 because the value of the node C is "H". However, the node D is already changed to "H" in the second cycle, so the value of the node D is not changed, that is, held set at "H". Further, the FF circuit 35 captures the "H" of the node A and the node B is changed from "L" to "H", so the value of the output node C of the AND circuit 36 is changed from "H" to "L". Still further, also at this time, it is determined that the redundant memory 12 can be relieved and hence the relief impossibility determination signal S21 is held set at "L". However, the value of the output node E of the AND circuit 38 is "H", so "H" is captured by the FF circuit 40 via the OR circuit 39 and the node G, that is, the STATUS signal is changed from "L" to "H".

In other words, by making a plurality of relief possibility determinations, a relief impossibility determination (STATUS signal="H") can be made.

Here, a method for determining whether or not a chip can be relieved by the use of the STATUS signal will be described. FIG. 6 is a diagram to show an example of a specification for a relief determination of the chip. As shown in FIG. 6, when the TE (inspection result determination signal) is a pass determination (output state is "L"), it is determined that a chip is a pass chip that does not require relief processing. Next, when the TE (inspection result determination signal) is a fail determination (output state is "H"), it is determined on the basis of the output state of the STATUS signal whether a chip is a pass chip or a fail chip. At this time, when the STATUS signal is "L", it is determined that a relief possibility determination is made (that the chip can be made a pass chip if the relief processing is performed), whereas when the STATUS signal is "H", it is determined that a relief impossibility determination is made (that the chip cannot be made a pass chip even if the relief processing is performed).

Moreover, while the third setting condition has been described above as a condition for outputting "H" as the relief control signal S6, this can be realized by providing relief address storage means and a comparator in addition to the circuit structure shown in FIG. 4.

That is, when a relief possibility determination is made the first time, its relief address is stored in the relief address storage means. Then, when a relief possibility determination is made the second or subsequent time, its relief address is compared with the address stored in the relief address storage means by the use of the comparator. When the two relief addresses correspond to each other as the result of comparison, this means that both redundant memories can be relieved by the same relief address (=the same relief information), so it is substantially not true that the redundant memories cannot be relieved. Thus, in this case, even if the STATUS signal is "H", it is determined that the redundant memories can be relieved.

Further, a method for controlling transfer of relief information also in consideration of the state of whether or not the relief processing portion 21 already stores relief information, which is the foregoing fourth setting condition, will be described.

Figure 7:
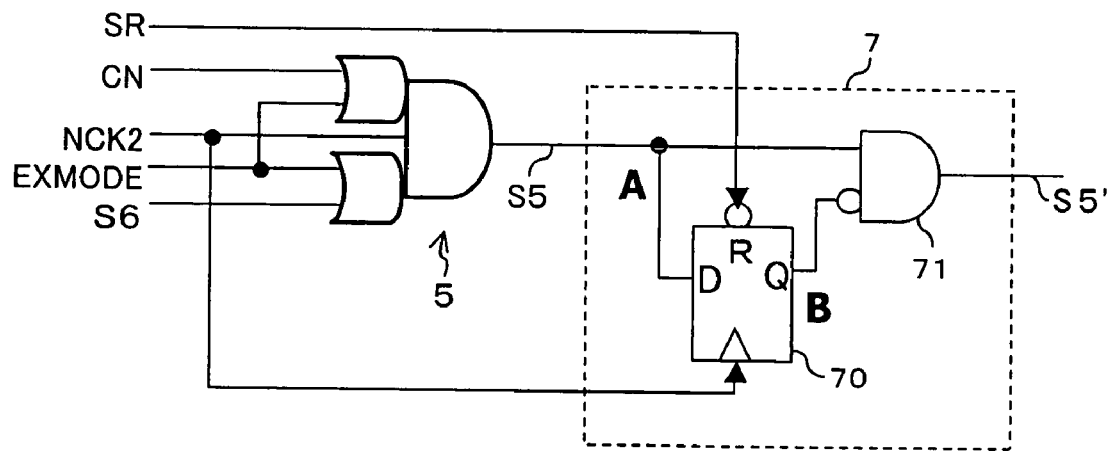
FIG. 7 is a structure example of a circuit for controlling transfer of relief information.
Figure 8:
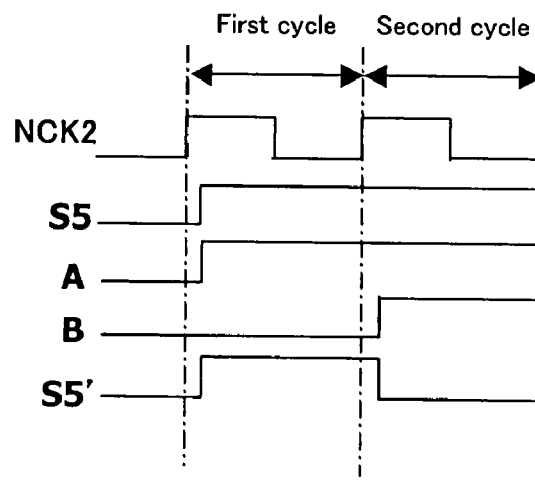
FIG. 8 is a timing chart to show a circuit operation in FIG. 7.

FIG. 7 is a circuit structure diagram and FIG. 8 is a timing chart to show the operation of the structure shown in FIG. 7. In FIG. 7, a second clock control portion 7 for considering whether or not the relief processing portion 21 already stores relief information is disposed at the rear stage of the clock control portion 5. The second clock control portion 7 includes an FF circuit 70 and an AND circuit 71.

As shown in FIG. 8, when it is determined that relief can be achieved and "H" is outputted as the relief control signal S6 in the first cycle, the clock S5 outputs "H" at the timing of the reverse second clock NCK2 according to the other input condition having already described. At this time, the FF circuit 70 is in a reset state by a system reset signal SR and hence the node B is "L". With this, the AND circuit 71 outputs "H" as the clock S5' to the relief processing portion 21, whereby the relief information is transferred. At this time, data "H" is captured by the FF circuit 70.

Next, because the node B is brought to the state of "H" in the second cycle, "H" is outputted as the relief control signal S6 and even if "H" is outputted as the clock S5, the output of the AND circuit 71 becomes "L", so the relief information is not transferred. As described above, by controlling the state of the clock S5', transfer of the relief information can be controlled.

<3. Program Step>

As for a program step, general contents necessary for understanding an inspection flow will be limitedly described and its detailed description will be omitted. Here, the technical principle of the present invention is not limited by a program mode.

In FIG. 1, it is assumed that specified relief information is stored in the shift register circuits L11 to L1x included in the relief processing portion 21. Moreover, although not shown, there is provided a program circuit for programming the relief information stored in the shift register circuits L11 to L1x in the electric fuse elements F11 to F1x.

As shown in FIG. 2A, the program control signal of "H" is serially outputted to the defect relief portions 211 to 21× and a program operation (operation of fusing down an electric fuse) is performed in a period during which the program control signal is "H". According to this structure example, the program operation is serially performed, so it is possible to eliminate an effect on the circuit operation such as IR drop caused by an excessive current. In the present invention, the relief processing portion is shared by the plurality of redundant memories and hence the number of defect relief portions is greatly reduced, so the program time required to perform the program operation serially can be greatly shortened.

<4. Reinspection Step>

As for a reinspection step, general contents necessary for understanding the inspection flow will be limitedly described and its detailed description will be omitted. Here, the technical principle of the present invention is not limited by a reinspection method.

In FIG. 1, even if the redundant memories 11, 12 have a defective cell, by the foregoing program operation, access to the defective memory cell is avoided and access to a spare memory cell is carried out. With this, the redundant memories 11, 12 can normally operate.

In FIG. 2A, the relief processing information S4 programmed in the electric fuse elements F11 to F1x is made effective by setting the rest signal. Then, the inspection is conducted in the same way as described in <1. Inspection step> and the redundancy relief is achieved and the inspection result signal is held set at "L". Then, when the reinspection is finished, an inspection finish signal is set to "H" only in a specified period.

<5. Analysis>

As described above, the relief information EXIN inputted to the relief information external input terminal 63 from the outside can be given to the relief processing portion 21 via the selector 6. Moreover, the relief information S3 outputted from the output portion 32 can be also outputted outside as data EXOUT via the relief information external output terminal 64. When redundancy relief is not normally achieved in the semiconductor, by using the external input/output like this, it is possible to analyze whether or not the relief can be achieved by the use of the relief information separately given from the outside or to output the relief information produced in the semiconductor to the outside and to analyze the contents.

As described above, according to this preferred embodiment, the relief processing portion 21 is shared by the plurality of redundant memories including the redundant memories 11, 12, which can operate independently of each other, so the number of relief processing portions in the chip can be decreased. With this, a chip area can be decreased and the time required to transfer the relief information and the time required to fuse down the electric fuse can be also shortened.

Moreover, the shift register circuits L11 to L1x as the relief information storage portions are serially connected to each other so as to serially transfer the data. In the operation of storing the relief information, the relief information S3 serially outputted from the test circuit 30 is stored in the shift register circuits L11 to L1x in the relief processing portion 21 by the use of the data transfer operation. For this reason, the relief information can be effectively transferred to the relief processing portion 21 and the need for arranging the much wiring to become the transfer paths of the relief information can be eliminated and an increase in the circuit area can be suppressed.

Further, in this preferred embodiment, the control of whether or not the relief information S3 is stored is realized by controlling the enabling/disabling of the clock S5 by the clock control portion 5 according to the capture control signal CN. With this technique, it is possible to surely control whether or not the relief information is stored. Here, needless to, say, the control of enabling/disabling the clock S5 can be realized also by a structure other than the clock control portion 5.

Still further, to control whether or not the relief information is stored, in addition to the control of enabling/disabling the clock to be given to the relief processing portion, other method can be also thought. For example, in the structure shown in FIG. 1, the respective relief information storage portions are constructed of register circuits each having a clock input and an enabling input. The second clock CK2 (or the clock NCK2 that is opposite in phase to the clock CK2) is inputted to the clock input and the capture control signal CN is inputted to the enabling input. This constitution can control whether or not the relief information is stored.

Second Embodiment

Figure 9:
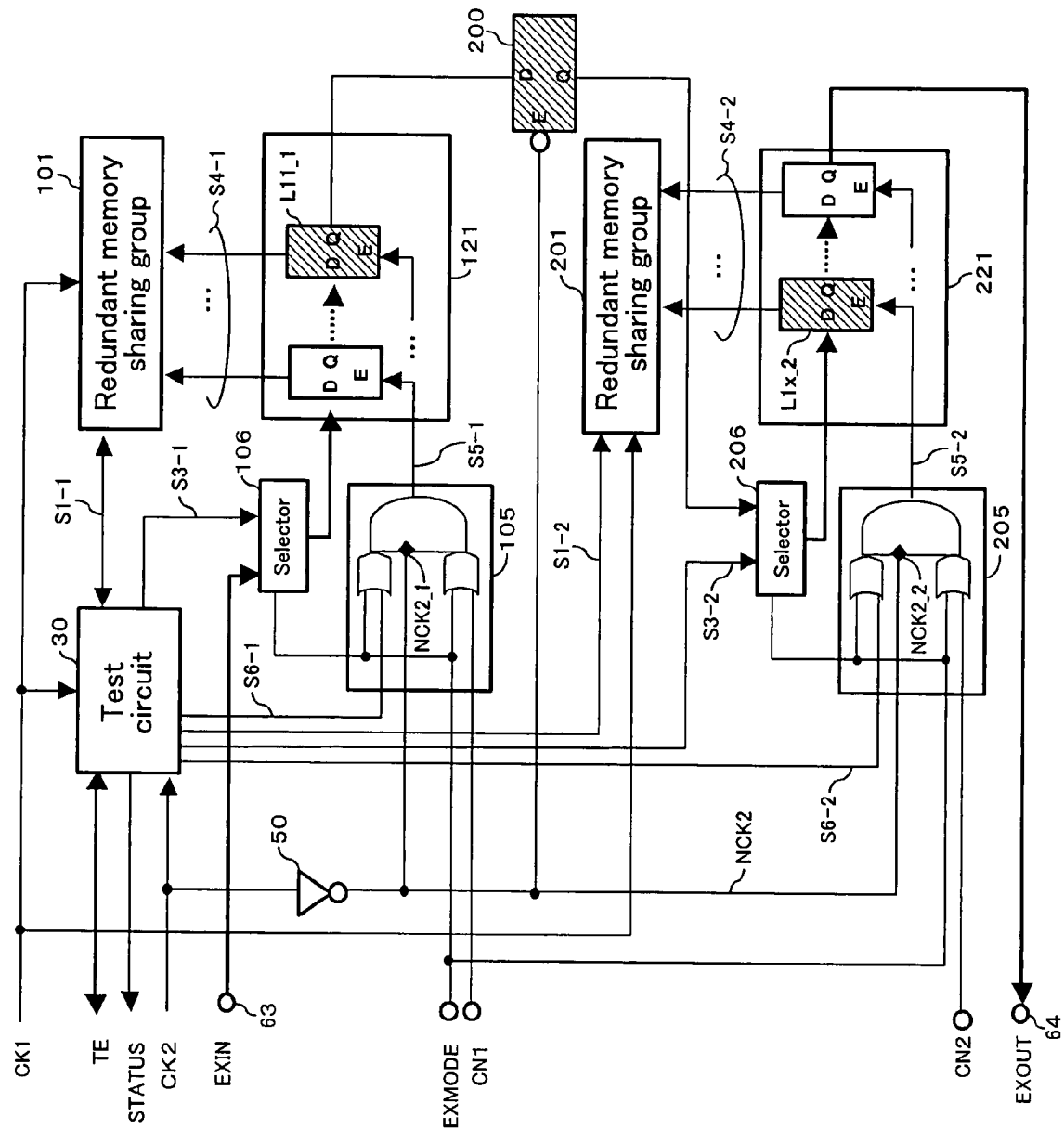
FIG. 9 is a block diagram to show the structure of a semiconductor device according to a second embodiment of the present invention.

FIG. 9 is a block diagram to show the structure of a semiconductor according to a second embodiment of the present invention. In FIG. 9, reference numerals 101, 201 denote redundant memory sharing groups, respectively, each comprising the same structure as in the redundant memory sharing group in FIG. 1. Moreover, relief processing portions 121, 221, clock control portions 105, 205, and selectors 106, 206 are provided respectively in correspondence to the redundant memory sharing groups 101, 201. Reference symbols CN1, CN2 denote capture control signals, S1-1 and S1-2 denote groups of inspection internal signals, S3-1 and S3-2 denote relief information, S5-1 and S5-2 denote clocks, and S6-1 and S6-2 denote relief control signals.

The structure shown in FIG. 9 is provided with a plurality of relief units of a structure including a plurality of redundant memories, the relief processing portion shared by the plurality of redundant memories, and the clock control portion, which have been described in the foregoing first embodiment. The plural relief units share the test circuit 30. The test circuit 30 outputs relief information S3-1, S3-2 and relief control signals S6-1, S6-2 for each relief unit. With this structure, the relief processing portions assigned to the plurality of redundant memories to be inspected by one test circuit can be increased, so a relief probability can be increased. Moreover, the clock control portion is provided for each relief processing portion, so the relief information can be transferred simultaneously in parallel and hence the test time can be shortened.

In this regard, in the structure shown in FIG. 9, the clock control portions may be removed from the structure of the relief unit: for example, the clock control portions 105, 205 may be replaced by a single clock control portion and the plurality of relief units may share the single clock control portion. With this, although the relief information cannot be transferred in parallel, the area of the clock control portion can be decreased and the wiring area of the transfer path of the relief information can be decreased.

Further, there may be provided a plurality of transfer units each having a structure including the foregoing plurality of relief units and a common control portion, and this plurality of transfer units may share the test circuit. With this, the area of the test circuit can be decreased.

Still further, in the structure shown in FIG. 9, the relief processing portions 121, 221 are serially connected to each other in such a way as to transfer data serially. The data input side of the relief processing portion 121 is connected to the relief information external input terminal 63 via the selector 106 and the data output side of the relief processing portion 221 is connected to the relief information external output terminal 64. With this, when the relief information is given from the outside of the semiconductor device, the relief information can be serially transferred by connecting the plurality of relief processing portions 121, 221 in the form of a chain and hence the transfer of the data can be easily controlled. Here, in FIG. 9, there is provided the structure including two relief processing portions, but even in a structure including three or more relief processing portions, it suffices to serially connect the relief processing portions in such a way as to transfer the data serially. Further, it suffices to connect the data input side of the top relief processing portion to the relief information external input terminal and to connect the data output side of the end relief processing portion to the relief information external output terminal.

Still further, a reference numeral 200 denotes a latch circuit disposed between the relief processing portions 121, 221 and for holding data. The latch circuit 200 has the output data of the relief processing portion 121 inputted thereto and outputs the input data of the relief processing portion 221. The latch circuit 200 can prevent an erroneous operation from being caused by clock skew between clock signals inputted to the individual relief processing portions when the data is captured.

Hereinafter, the data holding operation of the latch circuit 200 will be described through the operation of storing the relief information inputted from the external input terminal in the shift registers in the respective relief processing portions. At this time, it is assumed that: the external input switch signal EXIN is set to "H"; the selector 106 selectively outputs relief information EXIN inputted to the external input terminal 63; and the selector 206 selectively outputs the output information of the latch circuit 200.

FIG. 10 is a timing chart of a shift operation and FIG. 10A shows a case in which the latch circuit is not provided and FIG. 10B shows a case in which the latch circuit is provided. Here, the second clock CK2 is inputted to the semiconductor device and passes an inverter 50 and reaches the input points NCK2_1, NCK2_2 of gates provided in the respective clock control portions 105, 205. In this transmission path, it can be though that a clock skew may be developed by a difference in transmission delay.

Now, as shown in FIG. 10, it is assumed that the rise of a clock signal is slower at the input point NCK2_2 than at the point NCK2_1. In the case of FIG. 10A in which the latch circuit 200 is not provided, the relief input switch signal EXIN inputted to the external input terminal 63 is serially captured by the relief processing portion 121 according to the rise of the clock signal at the input point NCK2_1 via the selector 106. Moreover, the data outputted by the relief processing portion 121 is serially captured by the relief processing portion 221 according to the rise of the clock signal at the input point NCK2_2 via the selector 206.

In the cycle A, the shift register L11_1 of the last stage of the relief processing portion 121 stores data d0 at the rise of the clock signal at the input point NCK2_1. The storage of data in the shift register L1x_2 of the initial stage of the relief processing portion 221 needs to be performed in the next cycle B. However, in the case in which the latch circuit 200 is not provided, the shift register L1x_2 captures the data at the input point NCK2_2 at which the rise of clock signal is delayed than at the input point NCK2_1, so there is caused a false operation that the data d0 cannot be correctly stored.

In contrast to this, if the latch circuit 200 that captures the data at the reverse signal of NCK2 is arranged as shown in FIG. 9, as shown in FIG. 10B, the data d0 outputted in the cycle A is once captured by the latch circuit 200 in the period during which NCK2 is set to "L". With this, the initial step register L1x_2 of the relief processing portion 221 can correctly capture the data d0 at the rise of the clock signal at the input point NCK2_2 in the next cycle B.

(Setting of Relief Information)

Moreover, preferably, the plurality of redundant memories sharing the relief processing portion are connected to only a necessary defect relief portion of the defect relief portions included by the relief processing portion. In this case, unnecessary wiring can be omitted between the plurality of redundant memories and the relief processing portion. Further, the selector does not need to be provided, so selection control does not need to be performed and hence a layout area can be decreased. Still further, the plurality of redundant memories sharing the relief processing portion may be different from each other in bit configuration or in word configuration and may share a portion or all of the defect relief portions included by the relief processing portion. In this case, the relief processing portion can be shared by the redundant memories according to the layout specification of the chip without being subjected to any limit in terms of a test design.

Figure 11A:
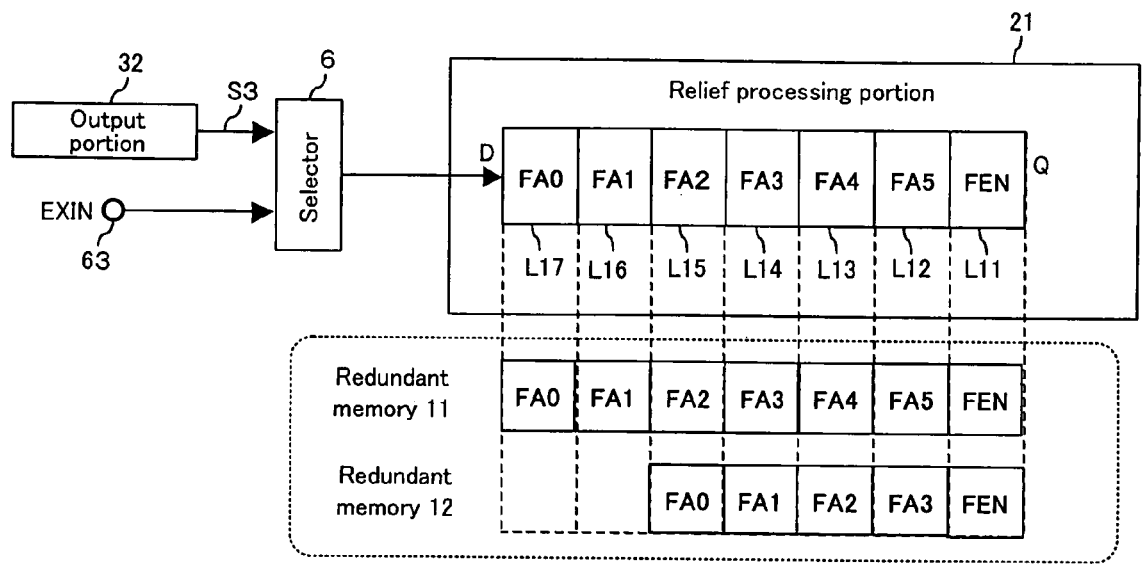
FIG. 11A is a diagram to show a setting example of relief information.
Figure 11B:
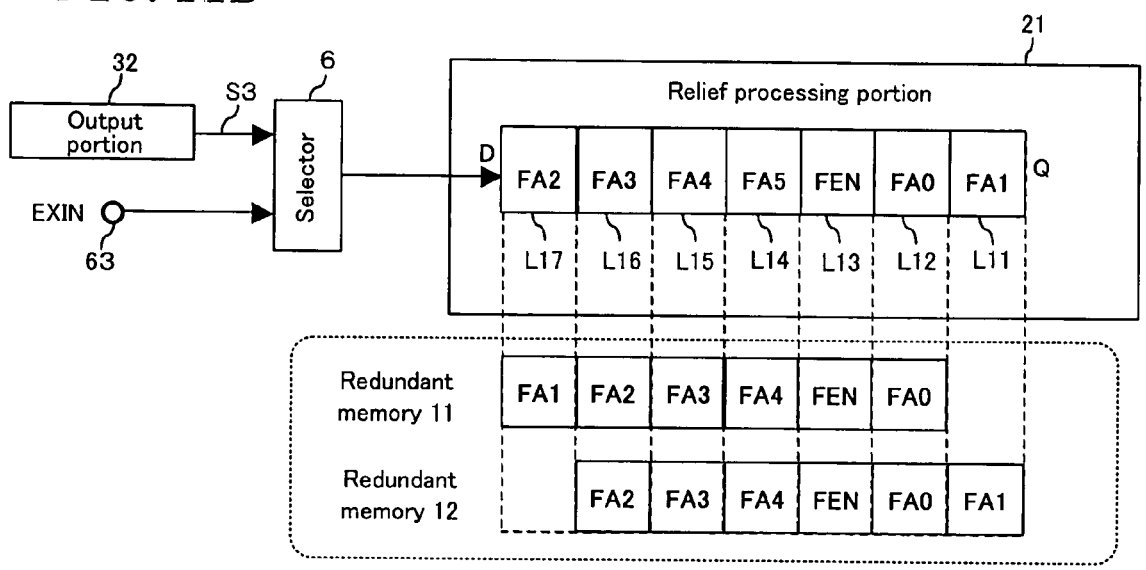
FIG. 11B is a diagram to show a setting example of relief information.

FIG. 11A and FIG. 11B are diagrams to show the setting examples of the relief information. In the drawings, reference symbols FA0 to FA5 denote information for relieving a defective address (hereinafter referred to as "relief address information") and FEN denotes a relief enabling bit. The relief enabling bit means information for setting the enabling/disabling of the relief processing and, for example, when the relief enabling bit is "1", the relief processing is enabled and when the relief enabling bit is "0", the relief processing is disabled.

In both of FIG. 11A and FIG. 11B, the redundant memories 11, 12 share the relief processing portion 21 and at that time, the shift register for storing the redundancy relief enabling bit (L11 in FIG. 11A and L13 in FIG. 11B) is commonly used by the redundant memories 11, 12. This is because when even one of the redundant memories sharing the relief processing portion needs redundancy relief, a relief operation is unified so as to achieve the redundancy relief in the same way for the other redundant memory. With this, as described above, when a defect exits at the same address, the redundancy relief can be achieved.

Here, it is assumed that the redundant memories 11, 12 are different from each other in the bit configuration or in the word configuration. Moreover, it is assumed that the redundant memories 11, 12 are connected to only necessary defect relief portions, respectively. For example, in the case of FIG. 11A, the redundant memory 11 is connected to only defect relief portions including the respective shift registers L11 to L17, whereas the redundant memory 12 is connected to only defect relief portions including a part of the shift registers L11 to L15.

FIG. 11A shows a case in which a relief enabling bit is stored in the shift register L11 disposed at the most remote part toward the direction of transfer of the relief processing portion 21. The redundant memory 11 uses all shift registers of the relief processing portion 21, whereas the redundant memory 12 uses a part of the shift registers of the relief processing portion 21. The redundancy relief enabling bit needs to be stored in the common shift register, so as shown in FIG. 11A, in the redundant memory 12, it is necessary to prevent the information from being stored in the shift registers L16, L17. This can be realized by increasing the number of clocks of the captured control signal CN by two clocks corresponding to a difference between the number of shift registers included in the relief processing portion 21 and the number of (five) pieces of relief information required by the redundant memory 12.

Further, FIG. 11B shows a case in which the relief enabling bit is stored in the shift register L13 located in the middle of the relief processing portion 21. In this case, the number of shift registers constructing the relief processing portion needs to be set in such a way that the left and right relief address information sandwiching the relief enabling bit can store a necessary maximum number of bits. Here, it is assumed that two bits of the redundant memory 12 are necessary on the right side of the relief enabling bit, whereas four bits of the redundant memory 11 are necessary on the left side. Thus, the shift registers L11 to L17 are set so as to store a total of seven bits combined with one bit of the relief enabling bit. In this case, both of the redundant memories 11, 12 use a part of the shift registers of the relief processing portion 21.

First, the redundant memory 11 needs to be set so as to prevent the relief information from being stored in the shift register L11. This can be realized by decreasing the number of clocks of the captured control signal CN by one clock corresponding to a difference between the number of shift registers included in the relief processing portion 21 and the number of (six) pieces of relief information required by the redundant memory 11. Next, the redundant memory 12 needs to be set so as to prevent the relief information from being stored in the shift register L17. This can be realized by increasing the number of clocks of the captured control signal CN by one clock corresponding to a difference between the number of shift registers included in the relief processing portion 21 and the number of (six) pieces of relief information required by the redundant memory 12.

According to the present invention, in the semiconductor device including the test circuit for producing the relief information for relieving a defective cell, the relief information can be effectively transferred without increasing the circuit area. Hence, the present invention is useful, for example, in decreasing the circuit area of the semiconductor device including many memories.

What is claimed is:

1. A semiconductor device comprising:
   a plurality of redundant memories, each of the plurality of redundant memories including a plurality of memory cells, being relievable when a defective cell exists in the memory cells, and being operable independently of each other;
   a relief processing portion wherein when at least one of the plurality of redundant memories has a defective cell, the relief processing portion stores relief information for relieving the redundant memory and performs processing of relieving the redundant memory, wherein
the relief information is stored in the relief information processing portion serially and is shared by the plurality of redundant memories.

2. The semiconductor device according to claim 1, wherein the plurality of redundant memories sharing the relieve information processing portion are different from each other in a bit configuration or in a word configuration and share a part or all of the relieve information of the relief processing portion.

3. The semiconductor device according to claim 1, wherein the relief processing portion includes an electric fuse element programmed by the stored relief information.

4. The semiconductor device according to claim 1, wherein the relieve processing portion includes a nonvolatile memory element having storage data set by the stored relief information.

5. The semiconductor device according to claim 1, wherein the relief processing portion is operable to hold the relief information when a power source of the semiconductor device is turned off.

6. The semiconductor device according to claim 1, wherein when the relief processing portion is plural in a single chip, the plurality of relief processing portions are serially connected to each other in such a manner that a data output terminal of one of the relief processing portions is connected to a data input terminal of another one of the relief processing portions while a data output terminal of the other relief processing portion is connected to a data input terminal of still another one of the relief processing portions.

7. The semiconductor device according to claim 6, comprising a latch circuit for holding data in connecting the relief processing portions to each other.

8. The semiconductor device according to claim 1, wherein the relief processing portion includes a plurality of defect relief portions including relief information storage portions capable of storing the relief information, and the relief information is stored in the relief information storage portions serially according to a data transfer operation.

9. The semiconductor device according to claim 8, wherein each of the plurality of redundant memories is connected to only the necessary defect relief portion of the defect relieve portions included in the relief processing portion.

10. The semiconductor device according to claim 8, comprising a test circuit that inspects the plurality of redundant memories and outputs the relief information when it is determined that the defective cell exists, wherein:
the test circuit outputs the relief information serially; and
the relief processing portion stores the relief information serially outputted from the test circuit in the relief information storage portion by use of its data transfer operation.

11. The semiconductor device according to claim 10, wherein the test circuit inspects each of the redundant memories and makes a determination of at least pass, relief possibility, or relief impossibility, and is operable to control whether or not the relief information outputted from the test circuit is stored in the relief processing portion on the basis of the determination of each of the redundant memories.

12. The semiconductor device according to claim 10, wherein the test circuit makes a determination of at least pass, relief possibility, or relief impossibility on the basis of the inspection of each of all the plurality of redundant memories sharing the relief processing portion, and is operable to control to allow the relief information outputted form the test circuit to be stored in the relief processing portion on the basis of the determination.

13. The semiconductor device according to claim 11, wherein only when the test circuit makes the determination of relief possibility in each redundant memory, the test circuit is operable to control to allow the relief information outputted from the test circuit to be stored in the relief processing portion according to a relief control signal outputted from the test circuit.

14. The semiconductor device according to claim 11, wherein in determination of the plurality of redundant memories sharing the relief processing portion, when relief possibility is determined twice or more, the test circuit is controlled to make the determination of relief impossibility.

15. The semiconductor device according to claim 14, wherein in determination of the plurality of redundant memories sharing the relief processing portion, a relief address at a first relief possibility determination is held and is compared with a relief address at a second or subsequent relief possibility determination, and wherein when these relief address correspond to each other, the test circuit is controlled not to make the determination of the relief impossibility.

16. The semiconductor device according to claim 11, wherein the relief information outputted from the test circuit is controlled to be stored in the relief processing portion irrespective of a state of use of the relief processing portion.

17. The semiconductor device according to claim 11, wherein another redundant memory sharing the relief processing portion determines whether or not the relief processing portion already stores relief information, wherein only when it is not stored, relief information outputted from the test circuit is controlled to be stored into the relief processing portion.

18. The semiconductor device according to claim 11, wherein data transfer operation of the relief storage portion is conducted according to a given clock signal, wherein the semiconductor device comprises a clock control portion for controlling enabling/disabling the clock signal according to a relief control signal as a determination that the test circuit outputs.

19. The semiconductor device according to claim 18, comprising a clock control portion for controlling enabling/disabling the clock signal according to a given capture control signal and the relief control signal.

20. The semiconductor device according to claim 19, comprising an external input terminal for inputting the capture control signal from outside the semiconductor device.

21. The semiconductor device according to claim 18, comprising a plurality of relief units each having a structure including the plurality of redundant memories, the relief processing portion shared by the plurality of redundant memories, and the clock control portion, wherein the test circuit outputs the relief information and the relief control signal for each relief unit, and the relief information outputted from the test circuit for each relief unit is controlled to be stored in the relief processing portion.

22. The semiconductor device according to claim 18, comprising a plurality of relief units each having a structure including the plurality of redundant memories and the relief processing portion shared by the plurality of redundant memories, wherein the relief information storage portions of the relief processing portions included in the relief units are connected to each other so that data is transferred sequentially, and the relief information transferred from the test circuit is transferred between the relief units with the use of the common clock control portion.

23. The semiconductor device according to claim 22, comprising a plurality of transfer units each having a structure including the plurality of relief units and the clock control portion, wherein the test circuit is shared by the plurality of transfer units.

24. The semiconductor device according to claim 10, wherein operations of the redundant memories and an inspection of the redundant memories by the test circuit are performed according to a first clock, and wherein an operation of storing the relief information is performed according to a second clock different from the first clock.

25. The semiconductor device according to claim 24, wherein in the operation of storing the relief information, the second clock signal is given to the test circuit whereas a clock signal that is opposite in phase to the second clock is given to the clock control portion.

26. The semiconductor device according to claim 10, comprising:
a relief information external input terminal for inputting relief information from outside the semiconductor device; and
a selector for selecting either the relief information outputted from the test circuit or the relief information inputted to the relief information external input terminal and for inputting the selected relief information to the relief processing portion.

27. The semiconductor device according to claim 26, comprising a clock control portion for controlling enabling/disabling the clock signal not according to the relief control signal and the capture control signal but according to the external input switch signal when the external input switch signal is in an enabling state.

28. The semiconductor device according to claim 27, wherein the external input switch signal also controls switching of the selector, wherein when the external input switch signal is in an enabling state, relief information inputted to the relief information external input terminal is selected.

29. The semiconductor device according to claim 10, comprising a relief information external output terminal for outputting relief information given to the relief processing portion to outside the semiconductor device.

30. The semiconductor device according to claim 10, wherein when the test circuit makes a determination of relief impossibility, an inspection finish signal showing that a subsequent inspection is not necessary is outputted.

31. The semiconductor device according to claim 10, wherein the relief processing potion performs relief processing of the redundant memory after the relief information is stored in the relief processing portion on the basis of the determination of all the to-be-inspected redundant memories.

32. The semiconductor device according to claim 31, wherein when an inspection is conducted under a plurality of voltage conditions, a series of inspections from determination processing to relief processing are performed for each voltage condition.

33. A semiconductor device comprising:
a plurality of redundant memories, each of the plurality of redundant memories including a plurality of memory cells, being relievable when a defective cell exists in the memory cells, and being operable independently of each other; and
a relief processing portion shared by the plurality of redundant memories wherein when at least one of the plurality of redundant memories has a defective cell, the relief processing portion stores relief information for relieving the redundant memory and performs processing of relieving the redundant memory, wherein:
the relief processing portion includes a plurality of defect relief portions each having a relief information storage portion capable of storing the relief information, the relief information storage portions being serially connected to each other thereby enabling serial transfer of data; and
the relief information is stored in the relief information storage portions serially according to its data transfer operation.

34. The semiconductor device according to claim 33, wherein the plurality of redundant memories are different from each other in a bit configuration or in a word configuration and share a part or all of the relief information of the relief processing portion.

35. The semiconductor device according to claim 33, wherein the relief processing portion includes an electric fuse element programmed by the stored relief information.

36. The semiconductor device according to claim 33, wherein the relief processing portion includes a nonvolatile memory element having storage data set by the stored relief information.

37. The semiconductor device according to claim 33, wherein the relief processing portion is operable to hold the relief information when a power source of the semiconductor device is turned off.

38. The semiconductor device according to claim 33, wherein the relief processing portion is plural and the plurality of relief processing portions are serially connected to each other to enable serial transfer of the data.

39. The semiconductor device according to claim 38, comprising a latch circuit for holding the data in connecting the relief processing portions to each other.

40. The semiconductor device according to claim 33, wherein each of the plurality of redundant memories is connected to only the necessary defect relief portion of the defect relief portions included in the relief processing portion.

41. The semiconductor device according to claim 33, comprising a test circuit that inspects the plurality of redundant memories and outputs the relief information when it is determined that the defective cell exists, wherein:
the test circuit outputs the relief information serially; and
the relief processing portion stores the relief information serially outputted from the test circuit in the relief information storage portion by use of its data transfer operation.

42. The semiconductor device according to claim 41, wherein the test circuit inspects each of the redundant memories and makes a determination of at least pass, relief possibility, or relief impossibility, and is operable to control whether or not the relief information is transferred to the relief processing portion on the basis of the determination of each of the redundant memories.

43. The semiconductor device according to claim 41, wherein the test circuit inspects all of the plurality of redundant memories and makes a determination of at least pass, relief possibility, or relief impossibility, and is operable to control whether or not the relief information is transferred to the relief processing portion on the basis of the determination.

44. The semiconductor device according to claim 42, wherein only when the test circuit makes the determination of relief possibility, the test circuit controls the relief processing portion in such a way as to store the relief information by a relief control signal.

45. The semiconductor device according to claim 42, wherein when the test circuit determines that two or more of the redundant memories can be relieved, the test circuit makes the determination of relief impossibility.

46. The semiconductor device according to claim 45, wherein the test circuit holds a relief address at a first relief possibility determination, and compares a relief address at a second or subsequent relief possibility determination with the held relief address, and wherein when these relief addresses correspond to each other, the test circuit makes the determination of relief possibility, whereas when these relief addresses do not correspond to each other, the test circuit makes the determination of relief impossibility.

47. The semiconductor device according to claim 42, wherein transfer of the relief information to the relief processing portion is conducted irrespective of whether or not the relief information is already transferred to the relief processing portion.

48. The semiconductor device according to claim 42, wherein transfer of the relief information to the relief processing portion is not conducted when the relief information is already transferred to the relief processing portion.

49. The semiconductor device according to claim 42, wherein data transfer operation of the relief processing portion is conducted according to a given clock signal, wherein the semiconductor device comprises a clock control portion for controlling enabling/disabling the clock signal according to a relief control signal which the test circuit outputs on the basis of the determination.

50. The semiconductor device according to claim 49, wherein the clock control portion controls enabling/disabling the clock signal according to a given capture control signal and the relief control signal.

51. The semiconductor device according to claim 50, comprising an external input terminal for inputting the capture control signal from outside the semiconductor device.

52. The semiconductor device according to claim 49, comprising a plurality of relief units each having a structure including the plurality of redundant memories, the relief processing portion shared by the plurality of redundant memories, and the clock control portion, wherein the test circuit is shared by the plurality of relief units and outputs the relief information and the relief control signal for each relief unit.

53. The semiconductor device according to claim 49, comprising a plurality of relief units each having a structure including the plurality of redundant memories and the relief processing portion shared by the plurality of redundant memories, wherein the clock control portion is shared by the plurality of relief units.

54. The semiconductor device according to claim 53, comprising a plurality of transfer units each having a structure including the plurality of relief units and the clock control portion, wherein the test circuit is shared by the plurality of transfer units.

55. The semiconductor device according to claim 41, wherein operations of the redundant memories and an inspection of the redundant memories by the test circuit are performed according to a first clock signal, and wherein an operation of storing the relief information is performed according to a second clock signal different from the first clock signal.

56. The semiconductor device according to claim 55, wherein in the operation of storing the relief information, the second clock signal is given to the test circuit whereas a clock signal that is opposite in phase to the second clock signal is given to the relief processing portion.

57. The semiconductor device according to claim 41, comprising:
a relief information external input terminal for inputting relief information from outside the semiconductor device; and
a selector for selecting either the relief information outputted from the test circuit or the relief information inputted to the relief information external input terminal and for inputting the selected relief information to the relief processing portion.

58. The semiconductor device according to claim 57,
wherein data transfer operation of the relief processing portion is performed according to a given clock signal,
wherein the semiconductor device comprises a clock control portion for controlling enabling/disabling the clock signal according to a relief control signal which the test circuit outputs on the basis of the determination, and a given capture control signal,
wherein the clock control portion has an external input switch signal inputted thereto; and
wherein when the external input switch signal is in an enabling state, the clock control portion controls enabling/disabling the clock signal not according to the relief control signal and the capture control signal but according to the external input switch signal.

59. The semiconductor device according to claim 58, wherein the selector has the external input switch signal inputted thereto, and wherein when the external input switch signal is in an enabling state, the selector selects relief information inputted to the relief information external input terminal.

60. The semiconductor device according to claim 41, comprising a relief information external output terminal for outputting relief information given to the relief processing portion to outside the semiconductor device.

61. The semiconductor device according to claim 41, wherein when the test circuit makes a determination of relief impossibility, the test circuit outputs an inspection finish signal to show that a subsequent inspection is not necessary.

62. The semiconductor device according to claim 41, wherein the relief processing portion performs relief processing after the inspection of the plurality of redundant memories is finished and the relief information based on the determination is stored.

63. The semiconductor device according to claim 62, wherein when an inspection is conducted under a plurality of voltage conditions, a series of processings from determination processing to relief processing are performed for each voltage condition.

64. The semiconductor device according to claim 1, wherein the semiconductor device is a single chip.

65. The semiconductor device according to claim 33, wherein the semiconductor device is a single chip.

* * * * *